(12) United States Patent
Powell et al.

(10) Patent No.: US 6,256,186 B1
(45) Date of Patent: Jul. 3, 2001

(54) ELECTROSTATIC CHUCKS

(75) Inventors: Kevin Powell, Bristol; David Andrew Tossell, Portishead; Alan Victor Iacopi; Mark Stephen Puttock, both of West Sussex, all of (GB)

(73) Assignee: Trikon Equipments Limited, Gwent (GB)

(*) Notice: Subject to any disclaimer, the term of this patent is extended or adjusted under 35 U.S.C. 154(b) by 0 days.

(21) Appl. No.: 09/150,669

(22) Filed: Sep. 10, 1998

Related U.S. Application Data

(63) Continuation-in-part of application No. PCT/GB98/01452, filed on Jun. 2, 1998.

(30) Foreign Application Priority Data

Jun. 3, 1997 (GB) .................................................. 9711273

(51) Int. Cl.$^7$ ................................................ H01T 23/00
(52) U.S. Cl. ........................................... 361/234; 279/128
(58) Field of Search ............................. 361/234; 279/128

(56) References Cited

U.S. PATENT DOCUMENTS

| | | | |
|---|---|---|---|
| 4,384,918 | * 5/1983 | Abe et al. ............................... | 361/234 |
| 4,842,683 | 6/1989 | Cheng et al. . | |
| 5,477,975 | 12/1995 | Rice et al. . | |
| 5,507,874 | * 4/1996 | Su et al. .................................... | 134/1 |
| 5,529,657 | 6/1996 | Ishii . | |
| 5,653,811 | 8/1997 | Chan . | |
| 5,777,838 | * 7/1998 | Tamagawa et al. .................. | 361/234 |
| 5,946,183 | * 8/1999 | Yamada et al. ....................... | 361/234 |

FOREIGN PATENT DOCUMENTS

| | | |
|---|---|---|
| 0459177 A2 | 12/1991 | (EP) . |
| 0506537 | 9/1992 | (EP) . |
| 0 607 043 | 7/1994 | (EP) . |
| 0651427 | 5/1995 | (EP) . |
| 0 680 072 A2 | 11/1995 | (EP) . |
| 0693774 | 1/1996 | (EP) . |
| 0791956 | 8/1997 | (EP) . |
| 08078191 | 3/1996 | (JP) . |
| 9134951 | 5/1997 | (JP) . |
| WO 9704478 | 2/1997 | (WO) . |

OTHER PUBLICATIONS

Patent Abstracts of Japan, vol. 095, No. 006, Jul. 1995 & JP 07 086179 A (Hitachi Ltd), Mar. 31, 1995, see abstract.
West Abstract of JP409186139A, Dry Etching Method, Tanaka et al., Jul. 15, 1997.*
Abstract of Japan 09–134,951 A; Electrostatic Chuck; Yamada et al.; May 20, 1997.*

* cited by examiner

*Primary Examiner*—Michael J. Sherry
(74) *Attorney, Agent, or Firm*—Jones Volentine, L.L.C.

(57) ABSTRACT

An electrostatic chuck 12 for a plasma reactor apparatus 10 comprises a base metallic section 23, a pair of electrodes 24 set in bonding material 27 and electrically insulated from the base by a plate 29 and a thick dielectric layer 20 (e.g. 0.5 to 1.5 mm), which covers the electrodes 24 and bonding material 27 and forms the support surfaces for wafers 31.

9 Claims, 2 Drawing Sheets

ELECTROSTATIC CHUCKS

This is a Continuation-In-Part of International Application No. PCT/GB98/01452, filed Jun. 2, 1998, the subject matter of which is incorporated herein by reference for all purposes.

BACKGROUND OF THE INVENTION

1. Field of the Invention

This invention relates to electrostatic chucks for clamping semi-conductor wafers and processing apparatus and methods utilising such chucks.

2. Description of the Related Art

In the micro-fabrication of semi-conductor, micro-mechanical, optical and other devices on or from semi-conductor wafers, it is common to pattern the upper layer of or on a semi-conductor wafer by depositing a photo-sensitive coating, defining the pattern using a lithographic process and developing the resultant pattern.

The developed photo-sensitive coating then forms a mask which can either be used to protect certain areas of the wafer from a subsequent etch process or the coating can be utilised as part of a "lift off" process where a subsequent layer is deposited over the patterned material and removal of the patterned material, lifts off the subsequent layer except where there were exposed areas defined by the pattern.

For many such processes the gases or vapours that are used at low pressure have a tendency to condense or otherwise adhere to surfaces which are cooler than the gas or vapour. This is a particular problem where the platen on which the wafer is located in the processing apparatus is cooled, because the build up of such material can effect the intimate contact between the wafer and the platen.

It will be understood that as wafers are exchanged during the production process, there is inevitably a period when the upper surface of the platen is exposed and hence by-products can build up on it. If the platen is constituted by an electrostatic clamp or chuck, this can be particularly problematic because the clamping becomes unreliable resulting in poor wafer cooling and other deleterious results.

Current approaches to this problem include allowing the chuck to warm up to gas ambient temperature, the chamber being pumped out to a high vacuum or an etch process being carried out while the wafer is absent from the chamber. Whilst this latter option is effective, it also etches away the very thin dielectric layers, which exist on prior art chucks, rapidly causing a break-down of the dielectric layer and hence of the clamping. The other options tend to slow down the production cycle and/or increase the cost of the apparatus.

In existing designs the dielectric layers are kept extremely thin, e.g. 4 $\mu$m–200 $\mu$m, so that low voltages can be used on the chuck and thus avoid high voltages appearing on the wafer. These dielectric layers are frequently defective due to pin holes and other faults, which cause failure of the electrostatic chucks.

BRIEF SUMMARY OF THE INVENTION

From one aspect the invention consists in an electrostatic chuck for clamping a semi-conductor wafer during processing, including a platen on which the wafer is received, the wafer receiving surface of the platen having a dielectric coating characterised in that the dielectric layer is between 0.5 and 1.5 mm thick.

The Applicants have determined, contrary to the industry's understanding and expectation, that dielectric layers of this thickness can be used with significantly increased voltages. Thus the voltage range may be between 2½ thousand and 7½ thousand volts and where, for example, the layer is approximately 1 mm thick, the clamping voltage maybe 5 thousand volts. The apparatus may include supply means for charging the platen to these voltages, in which case the voltage means may charge the chuck positively or negatively. Each wafer being clamped with alternatively positive and negative voltage to avoid build up of charge on the chuck.

From another aspect the invention consists in semi-conductor wafer processing apparatus comprising a plasma etching reactor, an electrostatic chuck as defined above and control means for processing, e.g. etching, a wafer when it is on the platen and for etching when no wafer is present.

The apparatus may further comprise heating means to maintain the walls of the chamber above ambient temperature and thus reduce the likelihood of deposition on those walls, whilst the platen may additionally or alternatively have means for cooling it below the ambient temperature of the chamber. Thus for example the chamber walls may be heated to approximately 50° C. where as the wafer may be cooled to approximately 10° C.

The apparatus may further include means for supplying oxygen and sulphur containing gases for the etch process when the wafer is present and means to supply oxygen and fluorine containing gases for processing the wafer and means to supply oxygen and fluorine containing gases for the etch process when the wafer is not present.

From a still further aspect the invention may consist in a method of processing semi-conductor wafers comprising clamping a wafer on an electrostatic chuck as defined above, maintaining the platen below ambient chamber temperature, processing (e.g. etching) an organic layer on the wafer using oxygen and sulphur containing gases, removing the wafer and whilst the wafer is not there using oxygen and fluorine containing gases to etch reaction by-products from the platen.

The chamber walls may be heated to above ambient temperature.

Although the invention has been defined above it is to be understood it includes any inventive combination of the features set out above or in the following description.

BRIEF DESCRIPTION OF THE DRAWINGS

The invention may be performed in various ways and the specific embodiment will now be described, by way of example, with reference to the accompanying drawings, in which.

DETAILED DESCRIPTION OF THE PREFERRED EMBODIMENTS

Figure 1:
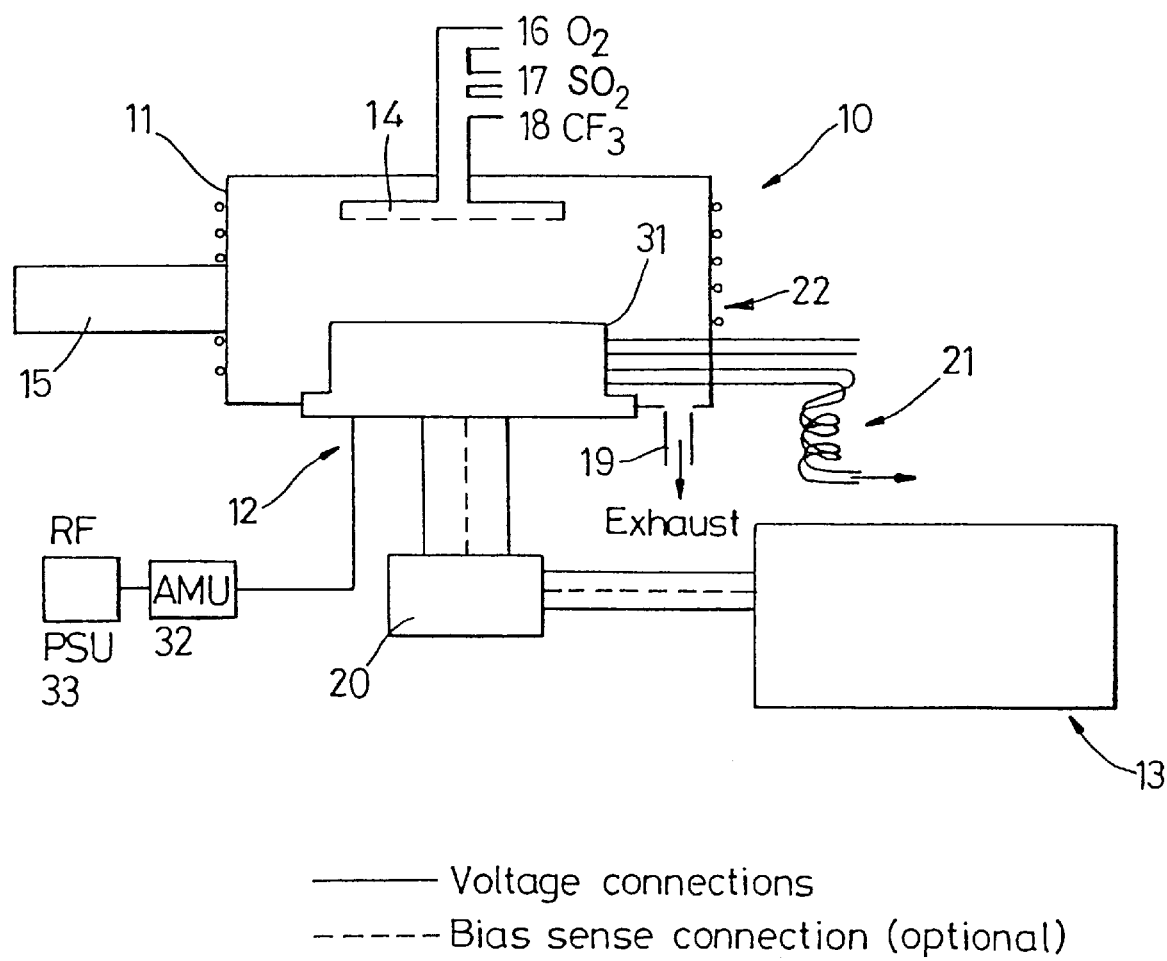
FIG. 1 is a schematic view of a plasma reaction chamber.

As can be seen in FIG. 1, plasma reactor apparatus, generally indicated at 10, includes a chamber 11 an electrostatic chuck 12 and clamping power supply 13, an upper electrode 14 typically of shower head design with gas inlets 16 to 18, an exhaust outlet 19 and wafer transfer mechanism 15. An RF filter 20 is positioned between power supply 13 and electrostatic chuck 12. The latter has a cooling circuit 21, whilst the heating coil 22 is provided around the chamber walls. A power supply 33 and matching circuit 32 are provided for biasing the wafer during processing.

Figure 2:
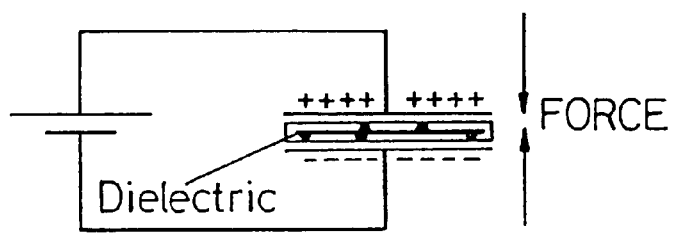
FIG. 2 is a schematic circuit showing the operation of a monopole electrostatic chuck.
Figure 3:
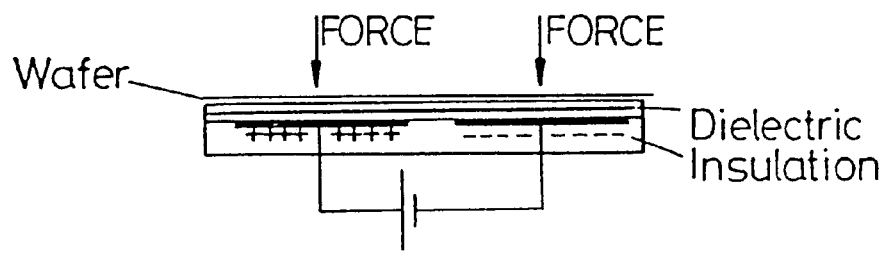
FIG. 3 is a schematic circuit illustrating the operation of a bi-polar electrostatic chuck.

Electrostatic chucks are, as has been mentioned, well known and they us the electrostatic force generated between opposite electrical charges to clamp the wafer to the platen. As can be seen in FIG. 1 the simplest arrangement is essentially, a parallel plate monopolar format, but in practice the bi-polar design of FIG. 2 is more reliable and here the wafer effectively becomes the connection between two identical capacitors.

Figure 4:
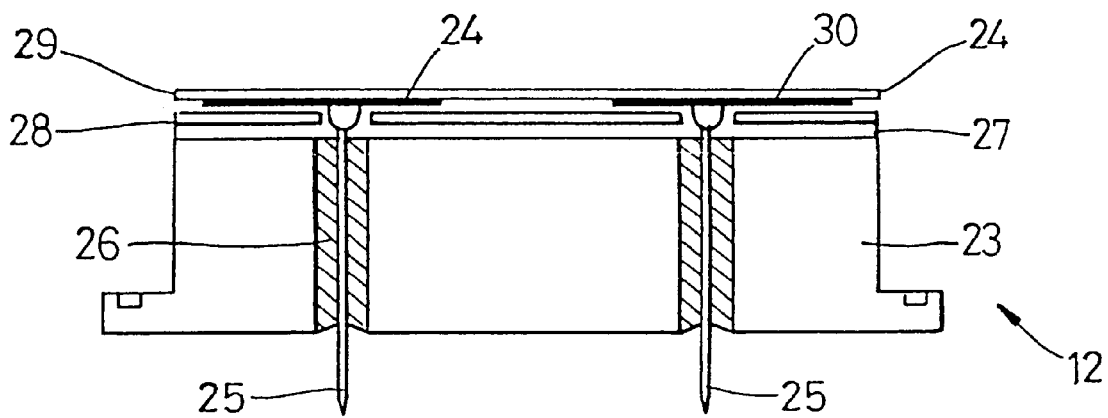
FIG. 4 is a vertical section through an electrostatic chuck.

The design of the chuck 12 is shown more specifically in FIG. 4 and it includes a base metallic section 23, which is water cooled by the cooling circuit 21, a pair of electrodes 24, with respective power connections 25, which pass up through the base 23 and are surrounded by insulating material 26. The electrodes 24 are set in bonding material 27 and are electrically separated from the base 23 by an intermediate insulating plate 28. A thick dielectric layer 29 is formed over the upper surface of the chuck 12, which is effectively defined by the upper surface of electrodes 24 and the intermediate bonding material 27. The upper surface 30 of the thick dielectric layer 29 receives the wafers such as illustrated at 31.

As has already been mentioned the layer 29 may have a thickness between 0.5 and 1.5 mm and is preferably approximately 1 mm thick. Previously such thicknesses would not have been used, because it was perceived that the voltage that would be necessary to create electrostatic clamping through such a layer would have induced a voltage on the wafer surface that would have interfered with the plasma processes to be performed on the surface of the wafer. The Applicants have determined, surprisingly, that the around 5,000 volts, which is required with a 1 mm thickness to achieve clamping, is acceptable for plasma processes of the type described.

The RF filter 20 removes the AC voltage and current from the platen to the power supply 13 during the time that the RF plasma is struck within the chamber but allows the DC clamping voltage to pass through to the platen during the inducing of the clamping charge or the reversal of the voltage to achieve unclamping.

The electrostatic chuck of the invention may be used in many processes, but it is particularly preferred for the processing of a multi-layer photo resist to obtain a completely patterned etch resist on the semi-conductor wafer.

The object is to have a well defined resist pattern of small geometries with an organic mask to enable subsequent etching processes. It is difficult to generate fine patterns accurately in resists, therefore an alternative process may be to use a thin top layer of photo-sensitive material over one or more non-photosensitive layers. In particular a two layer resist pattern consisting of $0.2\mu$ meter top layer and a $1.0\mu$ meter lower layer may be used. This resist will subsequently mask a polysilicon underlying layer in an etch process.

The top layer is then patterned and developed in the usual way exposing the thick lower layer. A sililation process is carried out, where by silicon is incorporated in to the thin top layer. The wafer is then processed in the plasma reaction apparatus 10 as follows.

The wafer 31 is placed on the surface 30 and maintained at approximately 10° C. by the cooling means 21. Electrostatic clamping is applied to provide good thermal conductivity. The heater 22 maintains the chamber walls at approximately 50° C. to stop deposition of etch gases on to their surfaces. Oxygen and sulphur dioxide are introduced by inlets 16 and 17 respectively under low pressure and are dissociated and activated by a plasma struck within the chamber 11. The plasma may be struck by any suitable means and one example is described in our European Patent No. 0271341 which is incorporated by reference.

The oxygen combines with silicon in the thin top layer, forming silicon dioxide and thus strengthening its masking properties. The oxygen further reacts with the exposed thick organic lower layer, converting it to gaseous bi-products that are pumped away via exhaust 19. Polymers are also being simultaneously formed and deposited. Where they are subjected to energetic bombardment they are removed, e.g. from horizontal wafer surfaces. Where they are not bombarded they ten to accumulate e.g. on vertical surfaces of the wafer. Thus it is possible to etch anisotropically (i.e. in a vertical direction only) to carry the thin top layer pattern accurately into the lower layer.

When this process is completed, the wafer 31 is exchanged for another. During the exchange process, the surface 30 is exposed to etch gases and by-products, which tend to deposit thereon, because that surface is cooler than the gases and by-products and the other surfaces in the chamber 11. The consequences of such deposition have been set out above.

An oxygen and carbon tetrafluoride plasma is consequently run for 5 seconds or so immediately prior to the next wafer being loaded onto the surface 30 and this removes any deposition on the platen. This cleaning process is viable within a production context, because the layer 29 is sufficiently thick to last for a realistic period, even though it will suffer some etching during the periods in which the surface 30 is exposed. Typically the layer 29 will be formed of aluminium oxide.

What is claimed is:

1. A semiconductor wafer processing apparatus, comprising:
   a plasma etching reactor;
   an electrostatic chuck for clamping a semiconductor wafer during processing, including a platen having a receiving surface on which the semiconductor wafer is received, wherein the receiving surface is coated with a dielectric layer having a thickness of between 0.5 and 1.5 mm; and
   control means for processing the semiconductor wafer when it is on the platen, and for performing an etching process when no semiconductor wafer is on the platen.

2. An apparatus as claimed in claim 1, wherein the plasma etching reactor includes a chamber having walls, and further comprising heating means to maintain the walls of the chamber above an ambient temperature of the chamber.

3. An apparatus as claimed in claim 2, further comprising a cooling means for cooling the platen to below the ambient temperature of the chamber.

4. An apparatus as claimed in claim 3 wherein the chamber of the walls are heated to approximately 50° C. by said heating means and wherein the semiconductor wafer is cooled to approximately 10° C. by said cooling means.

5. An apparatus as claimed in claim 1, further including means for supplying oxygen and sulphur-containing gases for processing the semiconductor wafer and means for supplying oxygen and fluorine-containing gas for the etching process when no semiconductor wafer is present on the platen.

6. A method of processing a semiconductor wafer comprising:

clamping a semiconductor wafer on an electrostatic chuck including a platen disposed in a chamber and having a receiving surface on which the semiconductor wafer is received, wherein the receiving surface is coated with a dielectric layer having a thickness of between 0.5 and 1.5 mm.;

maintaining the platen below an ambient temperature of the chamber;

processing an organic layer on the semiconductor wafer using oxygen and sulfur-containing gases; and removing the semiconductor wafer and then using oxygen and fluorine containing gases to etch reaction byproducts from the platen after the semiconductor wafer is removed from the platen.

7. A method as claimed in claim 6, further comprising biasing the platen to a voltage of between 2500 and 7500 volts during said clamping of the semiconductor wafer.

8. A method of processing a semiconductor wafers comprising:

clamping a first semiconductor wafer on an electrostatic chuck including a platen disposed in a chamber and having a receiving surface on which the first semiconductor wafer is received, wherein the receiving surface is coated with a dielectric layer having a thickness of between 0.5 and 1.5 mm.;

maintaining the platen below an ambient temperature of the chamber and processing an organic layer on the first semiconductor wafer using oxygen and sulfur-containing gases;

removing the first semiconductor wafer and then using oxygen and fluorine containing gases to etch reaction byproducts from the platen after the first semiconductor wafer is removed from the platen;

clamping a second semiconductor wafer on the electrostatic chuck;

maintaining the platen below the ambient temperature of the chamber and processing an organic layer on the second semiconductor wafer using oxygen and sulfur-containing gases.

9. A method as claimed in claim 8, further comprising biasing the platen to a voltage of between 2500 and 7500 volts during said clamping of the first and second semiconductor wafers.

* * * * *